United States Patent
Iwata et al.

(10) Patent No.: US 6,602,654 B2
(45) Date of Patent: Aug. 5, 2003

(54) DEVELOPING SOLUTION FOR A PHOTORESIST AND A METHOD FOR DEVELOPING THE PHOTORESIST

(75) Inventors: Keiichi Iwata, Niigata (JP); Kazushi Gouroku, Niigata (JP); Kenichi Nakamura, Niigata (JP)

(73) Assignee: Mitsubishi Gas Chemical Company, Inc., Chiyoda-ku (JP)

( * ) Notice: Subject to any disclaimer, the term of this patent is extended or adjusted under 35 U.S.C. 154(b) by 0 days.

(21) Appl. No.: 10/033,922

(22) Filed: Jan. 3, 2002

(65) Prior Publication Data
US 2002/0132193 A1 Sep. 19, 2002

(30) Foreign Application Priority Data
Jan. 12, 2001 (JP) .......................... 2001-005611

(51) Int. Cl.[7] .................................. G03F 7/32
(52) U.S. Cl. ........................ 430/325; 430/331
(58) Field of Search .............................. 430/331, 325

(56) References Cited

U.S. PATENT DOCUMENTS

| 4,108,886 A | * | 8/1978 | Ondetti ................... 260/455 R |
| 4,220,662 A | * | 9/1980 | Cook et al. ................. 424/319 |
| 5,905,063 A | | 5/1999 | Tanabe et al. |
| 6,323,169 B1 | | 11/2001 | Abe et al. |
| 2001/0006767 A1 | * | 7/2001 | Kawamonzen et al. ..... 430/331 |

FOREIGN PATENT DOCUMENTS

EP 901 160 A 10/1999

* cited by examiner

Primary Examiner—Richard L. Schilling
(74) Attorney, Agent, or Firm—Smith Patent Office

(57) ABSTRACT

Developing solution for a photoresist comprising an alicyclic amine compound and a non-metallic alkali compound is described. The developing solution exhibits excellent wettability and dissolution selectivity to alicyclic compound-based resists. Also, the developing solution does not produce dissolution residues, and it makes it possible to reliably form ultra fine patterns.

10 Claims, No Drawings

DEVELOPING SOLUTION FOR A PHOTORESIST AND A METHOD FOR DEVELOPING THE PHOTORESIST

BACKGROUND OF THE INVENTION

1. Field of the Invention

The present invention relates to developing solution for a photoresist.

2. Discussion of the Related Art

In lithography techniques used in the manufacturer of LSI devices, the demand for highly dense and ultra fine circuits has increased. Also, the source of light used for light exposure has been shifting away from conventional mercury lamps, such as i rays (wavelength: 365 nm), to sources such as KrF excimer lasers (wavelength: 248 nm) and even ArF excimer lasers (wavelength: 193 nm), which have relatively shorter wavelengths.

Accompanying this shift of the light source, usable photoresists have been shifting from conventional compositions comprising a novolak resin and a naphtoquinonediazide compound to chemical-amplification type resist compositions having a light-induced acid-generating agent as the base resin. Further, usable base resins have been shifting from conventional phenol-based resins, such as novolak resins, to alicyclic compounds, which have greater transparency to ArF excimer lasers. Examples of such alicyclic compounds include terpene, bornene, tricyclodecane, and adamantane.

An aqueous solution of alkaline compounds is generally used as the developing solution for such photoresists. In manufacturing LSI devices, however, an aqueous solution of a non-metallic alkali compound is used, as these compounds do not deteriorate device properties. Quaternary ammonium hydroxides, such as tetramethylammonium hydroxide (hereinafter referred to as TMAH), are preferable.

Such developing solutions do not have sufficient wettability for the surface of a resist and can cause problems such as not sufficiently penetrating into fine patterns on the resist. Also, such developing solutions do not uniformly act on the entire surface of a substrate. To overcome these problems, Japanese Granted Application Publication No. 6-38159 suggested some alternative developing solutions, including one that is prepared by adding a nonionic surfactant to an aqueous solution of an organic basic salt.

When the alicyclic compound-based resin for the ArF excimer laser is used, however, hydrophobicity on the surface of the resist becomes notable, and wettability to the resist is insufficient (this is even when the above-mentioned developing solution is used). Furthermore, depending on the kind of surfactant used in the developing solution, dissolution selectivity among highly exposed portions and lesser exposed portions is insufficient. Further, when developing solution used for conventional phenol resin-based resists is applied to alicyclic compound-based resists, there are problems, such as resist residues remaining in the portions to be dissolved after developing. Consequently, the demand for a developing solution that is capable of forming fine patterns with alicyclic compound-based resists has increased.

SUMMARY OF THE INVENTION

It is an object of the present invention to provide developing solution having excellent wettability and dissolution selectivity. It is another object of the present invention to provide developing solution that does not produce dissolution residues after developing. It is yet another object of the present invention to provide developing solution that is capable of reliably forming fine patterns. It is a further object of the present invention to provide a method for developing a photoresist using this developing solution.

As a result of diligent and continuous studies in view of the objects above, the inventors have determined a developing solution for photoresists comprising an alicyclic amine compound and a non-metallic alkali compound that has excellent wettability and dissolution selectivity to alicyclic compound-based resists. The inventors have also determined that such developing solution does not produce dissolution residues and that it makes possible the reliable formation of fine patterns. The present invention has thereby accomplished the intended objects.

DETAILED DISCUSSION OF THE PREFERRED EMBODIMENTS

More detailed embodiments are now discussed using examples below.

In the present invention, a non-metallic alkali compound is used as a main component of the developing solution. Non-metallic alkali compounds have conventionally been used in developing solutions for alkali soluble resists, more particularly, as aqueous solutions of primary, secondary or tertiary aliphatic amines; aqueous solutions of heterocyclic amines comprising at least one atom selected from the group consisting of carbon, nitrogen, oxygen and sulfur atoms; and aqueous solutions consisting of quaternary ammonium hydroxides. Among these, quaternary ammonium hydroxides are particularly preferable because they are not volatile and because of their handling ease and excellent developing capabilities.

Usable primary, secondary and tertiary aliphatic amines include propylamine, butylamine, dibutylamine and triethylamine.

Usable heterocyclic amines include pyrrole, pyrrolidine, pyrrolidone, pyridine, morpholine, pyrazine, piperidine, oxazole and thiazole.

Usable quaternary ammonium hydroxides include tetramethylammonium hydroxide (TMAH), trimethylethylammonium hydroxide, triethylmethylammonium hydroxide, tetraethylammonium hydroxide, tetrapropylammonium hydroxide, trimethyl (2-hydroxyethyl) ammonium hydroxide, triethyl (2-hydroxyethyl) ammonium hydroxide, and tripropyl (2-hydroxyethyl) ammonium hydroxide. Of these, TMAH and trimethyl (2-hydroxyethyl) ammonium hydroxide are particularly preferable. Quaternary ammonium hydroxides can be used individually, or in combinations of two or more.

The concentration of the non-metallic alkali compound in developing solution is appropriately selected so as to ensure a pH value between 13 and 14, depending on the kind of alkali being used. The concentration of the non-metallic alkali compound is preferably 0.1–10 wt %, and more preferably 1–5 wt %. When the concentration is lower than these ranges, dissolution requires a long time and development is prolonged. A concentration exceeding these ranges is not preferable because it degrades dissolution selectivity.

In addition to the aforementioned non-metallic alkali compounds, an alicyclic amine compound is also used as a main component of the developing solution of the present invention. The presence of the alicyclic amine compound in the developing solution serves to reduce the surface tension of the developing solution, to enhance the affinity of the developing solution with an alicyclic skeleton so that wettability to the resist increases, and to prevent the solution from producing residues in the portions to be dissolved upon development.

Examples of alicyclic skeletons of the alicyclic amine compounds used in the present invention include cyclo cyclic compounds, as represented by $C_nH_{2n}$ (n=3 or higher), bicyclo cyclic compounds and condensed rings of these compounds, particularly rings such as cyclobutane, cyclopentane, cyclohexane, cycloheptane, and cyclooctane. It is also possible to use a compound having a bridging hydrocarbon introduced into these alicyclic compounds. Examples of such compounds include spiro rings such as spiroheptane and spirooctane, norbonyl rings, adamantyl rings, bornene rings, mentyl rings, terpene rings such as methane rings, steroid skeletons such as thujane, sabinene, thujone and cholesteric rings, camphor rings, isocamphor rings, sesquiterpene rings, santone rings, diterpene rings, and triterpene rings.

An alicyclic amine compound has one or more amino groups in its molecule. Usable amino groups include amino groups represented by $=N.R_1R_2$ ($R_1$ and $R_2$ are hydrogen atoms or hydrocarbons having from 1 to 4 carbon atoms) and aminoalkyl groups represented by $=(CH_2)_n=N.R_3R_4$ (n=1 to 6; $R_3$ and $R_4$ are hydrogen atoms or hydrocarbons having from 1 to 4 carbon atoms).

The above-mentioned alicyclic amine compounds can be compounds which have one or more of the groups selected from the group consisting of an alkyl group, a hydroxyl group, a hydroxyalkyl group and a nitro group, and which are directly bonded to the alicyclic skeleton at some other point in the molecular structure than the amino group.

Preferable examples of such alicyclic compounds having an amino group in the molecular structure include aminocyclobutane; aminocyclopentane; aminocyclohexane; aminocycloheptane; 1, 2-diamino cyclohexane; 1, 3-diaminocyclohexane; 1, 4-diaminocyclohexane; aminomethylcyclobutane; aminomethylcyclopentane; aminomethylcyclohexane; 1, 2-bis-(aminomethyl)-cyclohexane; 1, 3-bis-(aminomethyl)-cyclohexane; 1, 4-bis-(aminomethyl)-cyclopentane; 1, 4-bis-(aminomethyl)-cyclohexane; 1-methyl-2, 4-diaminocyclohexane; 1-methyl-2, 6-diaminocyclohexane; methylene-bis-4, 4'-aminocyclohexane and methylene-bis-2, 4'-aminocyclohexane; as well as bis-(aminomethyl)-tricyclodecanes, aminomethylnorbornenes, bis-(aminomethyl)-norbornenes and isophoronediamines. Among these, alicyclic compounds having a cyclohexane ring—such as 1, 3-bis-(aminomethyl)-cyclohexane and 1, 4-bis-(aminomethyl)-cyclohexane—which have good biodegradability and less biotoxicity, are particularly preferable.

The concentration of the alicyclic amine compound in the developing solution can be in the range of 0.001–5 wt %, but preferably 0.01–2 wt %, and more preferably 0.02–1 wt %. When the concentration is lower than these ranges, the surface tension does not decrease, while the affinity to resists does. When the concentration exceeds these ranges, the dissolution selectivity becomes insufficient. Two or more kinds of alicyclic amine compounds may be mixed for use as required.

In addition to the alicyclic amine compound and the non-metallic alkali compound, well-known additives to conventional developing solutions, such as surfactants, organic solvents, and anticorrosion agents, may be used in the developing solution of the present invention.

The developing solution of the present invention is particularly suitable for a chemical-amplification type resist composition used with an ArF excimer laser. This resist is an alicyclic resist comprising a resin having both a protecting group, which is introduced in an alkali-soluble resin containing alicyclic compounds, and a light-induced acid-generating agent. Examples of such resists include adamantyls (methacrylates), isobonylmethacrylate polymers and derivatives thereof. Protecting groups include t-buthyloxycarbonyl groups and t-butoxy groups, among others.

Usable acid-generating agents upon light-exposure include triphenylsulfoniumhexafluoroantimonate, isocyanurate halide, triazine halide, nitrobenzylsulfonicacid ester, diazonaphtoquinone-4-sulfonicacid ester, and alkylsulfonicacid ester.

The developing solution of the present invention can also be used for resists comprising a conventional aromatic alkali soluble resin and light-induced acid-generating agent, and for alkali-development type positive and negative resists comprising an alkali-soluble novolak resin and an azide compound-based sensitizing agent.

Usable methods of developing a photoresist generally include paddling, in which a developing solution is dropped onto the surface of a substrate; dipping, in which a substrate is dipped into a developing solution tank; and spraying, in which developing solution is sprayed onto a substrate. The developing solution of the present invention can be used in any of these methods. The temperature at developing is preferably in the range of 10–60° C., and more preferably 15–30° C.

In developing an alicyclic resist for an ArF excimer laser, excellent uniformity of development on the entire surface of the substrate and excellent dissolution selectivity are achieved using the developing solution and method of developing a photoresist of the present invention. As a result, fine device structures can be formed on the substrate.

EXAMPLES

More detailed embodiments will be discussed using the examples and comparative examples below. The scope of the present invention, however, should not be construed to be limited to these examples.

Examples 1–10

Ten aqueous solutions, each comprising 2.38 wt % of non-metallic alkali compound (TMAH) and 0.2 wt % of an alicyclic amine compound were prepared for use as developing solution. The composition and surface tension of each prepared solution are shown in Table 1.

First, a positive photoresist for an ArF excimer laser was applied to a 6-inch silicon wafer by a spinner to form a positive photoresist layer having a thickness of 0.5 μm. The photoresist layer was then pre-baked on a hot plate at 100° C. for 2 minutes. Thereafter, selective light-exposing was conducted using a light source device with an ArF excimer laser having a wavelength of 193 nm. Immediately after this light-exposing, the photoresist was baked on the hot plate at 110° C. for 2 minutes.

The photoresist layer was then developed for 2 minutes using the developing solutions having the compositions listed in Table 1. The thickness of the photoresist layer in the unexposed portions of the silicon wafer after light-exposure was measured using a film thickness gauge, and the thickness of the remaining layer was calculated afterwards. The developed photoresist layer was observed under SEM (scanning electron microscope) for the existence of dissolution residues in the exposed portions of the photoresist. The results of the observations are shown in Table 1. In the table, ○ indicates that no residue was observed, Δ indicates that a small amount of residue was observed, and x indicates that a significant amount of residue was observed.

As shown in Table 1, when developing solutions having compositions consistent with the present invention were used, the results of development were excellent: diminution of the resist layer in the unexposed portions was suppressed, and no dissolution residues were observed in the exposed portion.

Comparative Examples 1–3

Aqueous solutions comprising 2.38 wt % of TMAH and either tributylamine or hexamethylenediamine as additives (and one control with no additives), were prepared as developing solution. Development and evaluation were conducted in a similar manner to the examples above. Table I shows the results. The symbols used in the table are the same as those used in the earlier examples.

In the comparative examples, the amount of the remaining layer in the unexposed portions was similar to that of the other examples, but dissolution residues, which were not observed in the other examples, were observed in the exposed portions of the resists in the comparative examples.

TABLE 1

| | Composition of Developing Solution (weight %) | | Surface Tension of Developing Solution (dyn/cm) | Developing Time (sec) | Resist Residues in Exposed Portion | Ratio of Resist Residues in Unexposed Portion |
|---|---|---|---|---|---|---|
| | Concentration of TMAH | Alicyclic Amine Compounds (concentration) | | | | |
| 1 | 2.38 | 1,3-bis-(aminomethyl)-cyclohexane (0.2) | 61 | 120 | ○ | 98.5 |
| 2 | 2.38 | 1,4-bis-(aminomethyl)-cyclohexane (0.2) | 63 | 125 | ○ | 98.0 |
| 3 | 2.38 | aminocyclo hexane (0.2) | 66 | 120 | ○ | 97.5 |
| 4 | 2.38 | 1-methyl-2,4-diaminocyclo hexane (0.2) | 65 | 120 | ○ | 97.0 |
| 5 | 2.38 | 1-methyl-2,6-diaminocyclo hexane (0.2) | 67 | 120 | ○ | 97.5 |
| 6 | 2.38 | isophorone diamine (0.2) | 58 | 120 | ○ | 98.0 |
| 7 | 2.38 | methylene-bis-4,4'-aminocyclo hexane (0.2) | 66 | 125 | ○ | 97.0 |
| 8 | 2.38 | methylene-bis-2,4'-aminocyclo hexane (0.2) | 67 | 120 | ○ | 97.0 |
| 9 | 2.38 | aminomethyl norbornene (0.2) | 66 | 120 | ○ | 97.0 |
| Examples | | | | | | |
| 10 | 2.38 | bis-(aminomethyl)-tricyclodecane (0.2) | 65 | 120 | ○ | 97.0 |
| Comparative Examples | | | | | | |
| 1 | 2.38 | none | 72 | 120 | x | 97.0 |
| 2 | 2.38 | tributylamine (0.2) | 70 | 120 | Δ | 97.0 |
| 3 | 2.38 | hexamethylene diamine | 68 | 120 | Δ | 96.5 |

Effects of the Present Invention

The developing solution of the present invention is excellent in wettability to alicyclic compound-based resists and can enhance the uniformity of development. Furthermore, the developing solution of the present invention makes it possible, when using an ArF excimer laser as light source, to accurately and reliably form patterns with an ultra fine structure, since the dissolution selectivity is excellent and the production of dissolution residues after developing is avoided.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application no. 2001-005611 filed Jan. 12, 2001 is hereby incorporated by reference.

What is claimed is:

1. A developing solution for developing a photoresist comprising an alicyclic amine compound and a non-metallic alkali compound wherein the concentration of said alicyclic amine compound is 0.02–1 wt % and the concentration of said non-metallic alkali compound is 1–5 wt %.

2. The developing solution as defined in claim 1, wherein said non-metallic alkali compound comprises at least one compound selected from the group consisting of an aliphatic amine compound, a heterocyclic amine compound and a quaternary ammonium hydroxide.

3. The developing solution as defined in claim 1, wherein said alicyclic amine compound is a compound selected from the group consisting of a cyclo cyclic compound represented by $C_nH_{2n}$ (n=3 or higher), a bicyclo cyclic compound, a compound having a condensed ring of at least one of the cyclo cyclic compound and the bicyclo cyclic compound and a compound having a structure in which a bridging hydrocarbon is introduced into at least one of the cyclo cyclic compound and the bicyclo cyclic compound.

4. The developing solution as defined in claim 1, wherein said alicyclic amine compound is a compound comprising a cyclohexane ring.

5. The developing solution as defined in claim 1, wherein the photoresist is a chemical-amplification resist for an ArF excimer laser, the chemical-amplification resist comprising an alicyclic compound.

6. A method for developing a photoresist comprising the steps of:

exposing the photoresist; and developing the exposed photoresist using a developing solution comprising an alicyclic amine compound and a non-metallic alkali compound wherein the concentration of said alicyclic amine compound is 0.02–1 wt % and the concentration of said non-metallic alkali compound is 1–5 wt %.

7. The method for developing a photoresist as defined in claim 6, wherein said step of developing includes using a non-metallic alkali compound that comprises at least one compound selected from the group consisting of an aliphatic amine compound, a heterocyclic amine compound and a quaternary ammonium hydroxide.

8. The method for developing a photoresist as defined in claim 6, wherein said step of developing includes using an alicyclic amine compound that is a compound selected from the group consisting of a cyclo cyclic compound represented by $C_nH_{2n}$ (n=3 or higher), a bicyclo cyclic compound, a compound having a condensed ring of at least one of the cyclo cyclic compound and the bicyclo cyclic compound and a compound having a structure in which a bridging hydrocarbon is introduced into at least one of the cyclo cyclic compound and the bicyclo cyclic compound.

9. The method for developing a photoresist as defined in claim 6, wherein said step of developing includes using an alicyclic amine compound that is a compound comprising a cyclohexane ring.

10. The method for developing a photoresist as defined in claim 6, wherein the photoresist is a chemical amplification resist for an ArF excimer laser, and the chemical amplification resist uses an alicyclic compound.

* * * * *